United States Patent [19]

Authier et al.

[11] 4,113,532

[45] Sep. 12, 1978

[54] PROCESS FOR PRODUCING LARGE-SIZE SUBSTRATE-BASED SEMICONDUCTOR MATERIAL UTILIZING VAPOR-PHASE DEPOSITION AND SUBSEQUENT RESOLIDIFICATION

[75] Inventors: Bernhard Authier; Rudolf Griesshammer, both of Burghausen; Franz Köppl, Altötting; Winfried Lang, Burghausen; Erhard Sirtl, Marktl, Inn; Heinz-Jörg Rath, Burghausen, all of Fed. Rep. of Germany

[73] Assignee: Wacker-Chemitronic Gesellschaft fur Elektronik-Grundstoffe mbH, Burghausen, Fed. Rep. of Germany

[21] Appl. No.: 737,249

[22] Filed: Nov. 1, 1976

[30] Foreign Application Priority Data

Aug. 25, 1976 [DE] Fed. Rep. of Germany ....... 2638269

[51] Int. Cl.² .................. H01L 21/477; H01L 21/84; H01L 31/00
[52] U.S. Cl. ....................... 148/174; 29/572; 148/1.5; 148/175; 156/605; 156/612; 156/616 R; 357/30; 357/59; 427/85; 427/86; 427/113
[58] Field of Search .................. 148/1.5, 174, 175; 156/605, 612, 616; 136/89; 427/85, 86, 113; 357/30, 59; 29/572

[56] References Cited

U.S. PATENT DOCUMENTS

| 2,880,117 | 3/1959 | Hanlet | 148/174 X |
|---|---|---|---|
| 3,078,328 | 2/1963 | Jones | 148/174 X |
| 3,134,906 | 5/1964 | Henker | 136/89 X |
| 3,141,849 | 7/1964 | Enk et al. | 156/605 |
| 3,335,038 | 8/1967 | Doo | 148/175 |
| 3,441,454 | 4/1969 | Shaikh | 148/188 |
| 3,558,376 | 1/1971 | Schmidt et al. | 148/174 X |
| 3,900,943 | 8/1975 | Sirtl et al. | 29/572 |
| 3,914,856 | 10/1975 | Fang | 148/174 X |
| 3,961,997 | 6/1976 | Chu | 148/174 |

OTHER PUBLICATIONS

Chu et al., "Polycrystalline Silicon Solar Cells . . . Applications", 11th IEEE Photospecialist Conf., May 6-8, 1975, pp. 303-305.
Chicotka et al., "Improving the Metallurgical Quality of Semiconductors" I.B.M. Tech. Discl. Bull., vol. 13, No. 12, May 1971, pp. 3788-3789.
Filby et al., "Single-Crystal Films of Silicon on Insulators" Brit. J. Appl. Phys., 1967, vol. 18, pp. 1357-1382.
Chu, T. L., "Polycrystalline Silicon Layers for Solar Cells" J. Vac. Sci. Technol., vol. 12, No. 4, Jul./Aug. 1975, pp. 912-915.
Chu et al., "Polycrystalline Slicon on Coated Steel Substrates" J. Electrochem. Soc., vol. 122, No. 12, Dec. 1975, pp. 1681-1685.
Hovel et al., "Minority Carrier . . . Thin Film Solar Cell", I.B.M. Tech. Discl. Bull., vol. 18, No. 2, Jul. 1975, pp. 544-545.

*Primary Examiner*—R. Dean
*Assistant Examiner*—W.G. Saba
*Attorney, Agent, or Firm*—Allison C. Collard

[57] ABSTRACT

A process for producing large-size, substrate-based semiconductor material of silicon deposited on a substrate body from the gaseous phase, which comprises the steps of heating a substrate body by direct current passage to deposition temperature, contacting said body with a gaseous silicon-containing mixture to which a dopant has been added, until a deposit having a thickness from about 10 to 200 μm has been formed, subsequently melting 80 to 100% of the deposited silicon layer from the free surface downward, and resolidifying the molten silicon by adjustment of a temperature gradient from the substrate body upward. Large-sized plates obtained by cutting up the semiconductor material are used as solar cells.

10 Claims, 1 Drawing Figure

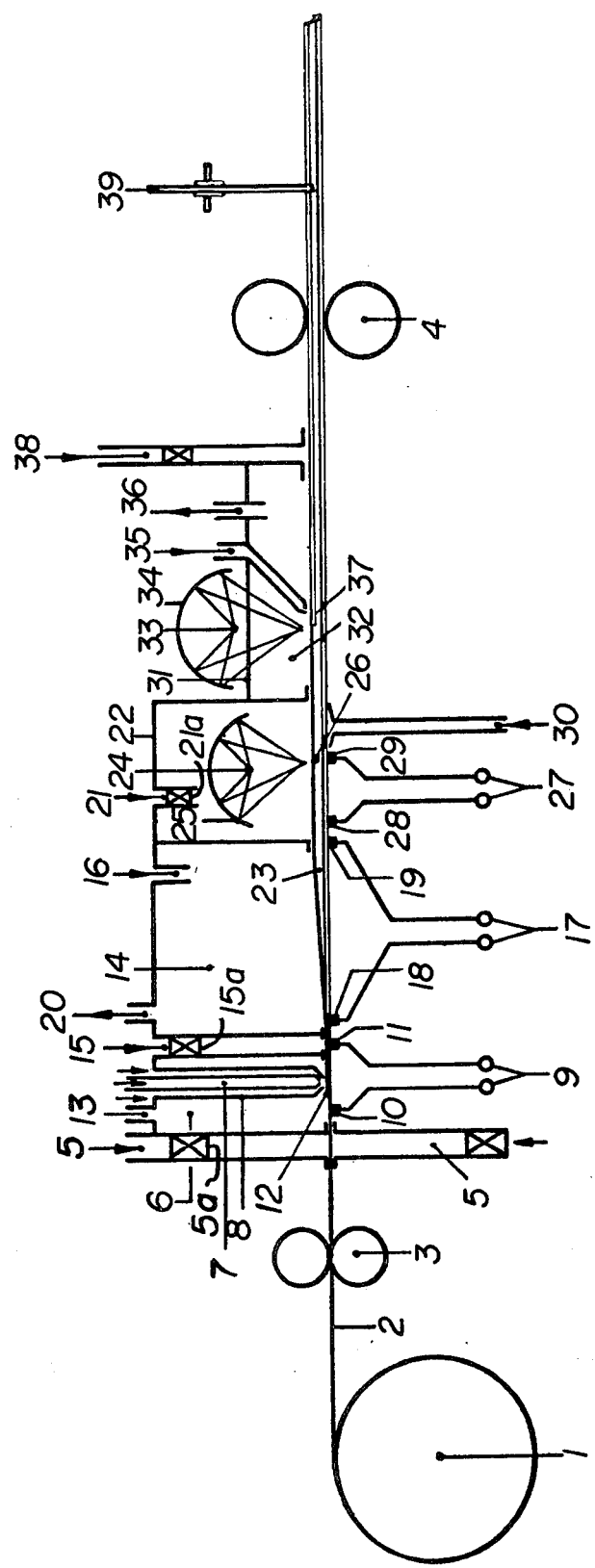

PROCESS FOR PRODUCING LARGE-SIZE SUBSTRATE-BASED SEMICONDUCTOR MATERIAL UTILIZING VAPOR-PHASE DEPOSITION AND SUBSEQUENT RESOLIDIFICATION

The present invention relates to a process for producing large-size, substrate-based semiconductor material, in which silicon is deposited from the gaseous phase on a suitable substrate body.

Solar cells, such as used up to now in space travel as current generators, are much too expensive for large-scale terrestrial application. The production of solar cells from high-purity, monocrystalline silicon rods cannot be considered for mass production, since the expenses for labor and construction in the processing of the rods, during which about 70% of the materials are lost, are quite prohibitive.

That is the reason why, for some years now, attempts have been made to use cheaper, substantially polycrystalline silicon as basic material, though with the dismissal of monocrystalline material, the effectiveness of the solar cells made of such materials, has dropped notably, and amounts at this time to only a few percent.

A first breakthrough to obtain cheaper, reasonably useful silicon material as basic material has been disclosed in DT-OS 25 08 803, according to which silicon is directly cast into thin plates under the influence of a temperature gradient. From this material, which has larger, monocrystalline areas, solar cells having an efficiency of 5% can already be made.

According to investigations of T.L. Chu, solar cells may be made by depositing silicon from silane or trichlorosilane on small graphite discs in an epireactor. The maintenance of high substrate temperatures, low rates of deposition, and the composition of the gases used for deposition, determine substantially the efficiency of the solar cells made therefrom, which may be increased by a heat treatment of the deposited silicon, but even then reaches 5% at the most (see, *Journal of Electrochem. Society*, 1976, pages 106-110).

It is the object of the present invention to provide a process for producing solar cell material, in which the expenses of labor and the operations incurred for making ready to use solar cells from semiconductor base materials, are at least substantially reduced.

In accordance with the invention, this object can be accomplished by providing a planar body heatable by direct current passage to deposition temperature, as a substrate, onto which silicon can be deposited from a gaseous compound containing an added dopant; the thickness of the deposit may be from about 10-200 $\mu$m. Subsequently, 80 to 100% of this silicon layer, depending on the thickness thereof, is melted in the direction from the surface down, and thereafter, resolidified by appropriate cooling from the substrate body upwardly.

As substrate bodies which are heatable by direct current passage, we mention, for instance, planar bodies of carbon, such as glass carbon, carbon laminates or knitted bodies, graphite plates, carbon-coated insulation bodies of ceramics or glass, and best of all, graphite foil.

Such graphite foils are made, according to information from the producers, from pure, well-ordered graphite in which, by chemical or thermal treatment, the spacing of the layers in the crystal lattice of the graphite is extended to a multiple of the normal value of 3.35A. The resulting bulk weight consisting of worm-shaped single pieces is treated subsequently on calanders or presses to obtain a denser final product, the layers of the graphite lattice being solidly united once more by mere mechanical pressure.

In addition to substrate bodies based on carbon, metallic substrate bodies are also very well suited, e.g., planar bodies of titanium, or tantalum, steel bands or sheets, and especially bands or sheets of molybdenum, which are preferred substrates. Molybdenum has an expansion coefficient which differs but slightly from that of silicon, which results in good adhesion between substrate and deposited layers; furthermore, molybdenum does not furnish recombination centers into the adjacent silicon at a high diffusion rate.

Before allowing the deposition of the silicon proper to take place, it may be advantageous to apply a thin intermediate layer, e.g., of 1-5 $\mu$m, in order to obtain a good ohmic contact, that is to say, the contact between the substrate body and the silicon should have a linear current-voltage characteristic independent of the polarity and having a low ohmic resistance. The intermediate layer has the added advantage that the substrate body, e.g., the graphite foil will not get into direct contact with the silicon which is especially reactive at the conditions of the process. The intermediate layer also has a getter effect so that metal atoms rapidly diffusing during the cooling process will collect in the intermediate layer.

Materials useful for an intermediate layer of this type are, e.g., metal borides, such as tantalum boride, tungsten boride or especially molybdenum boride in the case of an adjacent p-doped silicon layer, or metal phosphides, e.g., molybdenum or tungsten phosphide, in the case of an adjacent n-doped silicon layer.

The intermediate layer can be made by brushing or spraying suitable compounds onto the substrate body, or by pyrolytic decomposition of appropriate gaseous compounds. Metal boride layers may be obtained from corresponding metal carbonyls with diborane, whereas phosphides are obtainable by decomposition of metal carbonyls in the presence of phosphine. Tungsten phosphide may also be made, e.g., by pyrolytic decomposition of the tungsten trifluorophosphine complex.

For the decomposition of the silicon layer, the substrate body, with or without intermediate layer, is heated to the necessary deposition temperature which depends on the gas to be decomposed; generally, the temperature ranges from 800° to 1400° C, and in the preferred use of trichlorosilane + Hydrogen, to about 1000° to 1250° C.

As gases from which silicon is to be deposited, we mention, e.g., silicon hydride (monosilane), monochlorosilane, dichloro-trichloro-tetrachlorosilanes and hexachloro disilane alone or in mixture with, if necessary, with addition of hydrogen or inert gases, such as argon or helium.

Already during the deposition, dopants are added to the deposition gas, for instance, phosphorus, arsenic or antimony, which cause n-conduction, or boron, aluminum, gallium or indium compounds, which result in p-conduction.

The deposition is discontinued after the desired layer thickness is obtained in each case, about 10-200 $\mu$m, preferably 50-150 $\mu$m, whereafter 80-100% - or in the case of an intermediate layer 80-95% of the thickness of the layer, are melted from the surface down.

The melting of the silicon layer is effected advantageously by energy input from the substrate body and simultaneously by heating lamps arranged above the surface of the silicon layer.

Preferably, the main load of the required energy is provided by heating of the substrate body, so that the amount of energy needed for the melting of the silicon layer from the top down by heat sources arranged above the silicon layer will be minimized. This permits the use of inexpensive, commercially available heating lamps. In this embodiment of the invention, the substrate body, e.g., the graphite foil, is heated to such a degree by direct current passage that the adjacent silicon layer is brought up to, e.g., 1100°–1250° C. When molybdenum band is used as the substrate body, it is heated up to 800°–1000° C, in order to avoid any substantial alloy formation with the adjacent silicon layer. The additional heat required to heat silicon to the melting temperature of 1410° C is applied by conventional heating lamps radiating upon the surface of the silicon layer.

Another possibility of melting the silicon layer consists of using a glow discharge under normal pressure in an atmosphere of hydrogen or an inert gas atmosphere containing at least a substantial amount of hydrogen; this is done by connecting the electrically conductive substrate as cathode and moving a metal strap or bracket connected as an anode, in a suitable distance over the silicon surface. This mode of operation is, however, only applicable when the entire silicon surface is to be melted down to the substrate body. A separate substrate heating is in that case, of course, dispensable.

The liquid silicon layer or the melted portion of the silicon layer is subsequently brought to controlled resolidification, by adjusting a vertical temperature gradient extending from the substrate body to the surface of the silicon layer, causing the temperature level to drop below the melting point of the silicon. This may be done, e.g., by slowly decreasing the electrically controlled substrate heating which results in a solidification of the silicon layer from the substrate body toward the free surface, if the lamps alone are not sufficient to keep the silicon layer in molten state.

The solidification process can, of course, be shortened by reducing the radiation energy of the lamps, and this in such a manner that within the liquid silicon layer, a vertically directed temperature gradient becomes adjusted amounting to about 30°–100° C. Furthermore, a more rapid cooling of the substrate body can be achieved by passing a cooling gas, e.g., argon, along.

According to the preferred mode of operation, a pn-transition is formed in the surface of the silicon layer in a subsequent step by again melting the remelted silicon layer at the surface and introducing into that molten layer a dopant which dopes silicon oppositely as compared to the dopants in the adjusted silicon layer. When, for instance, the silicon layer was p-doped, so much phosphorus, arsenic or antimony would be added to the surface remelted for the second time as is required for making the last-mentioned layer n-conductive.

Yet another possibility consists of letting the molten silicon layer resolidify only until a thin liquid surface film remains and allowing an appropriate dopant to enter that film by diffusion. Instead of melting the surface of the silicon layer to, for instance, 0.3–1.5 μm in order to introduce the required dopant from the gas phase, thus pass phosphine, in the case of phosphorus, into the layer, it is also possible to brush an appropriate dopant onto the solid surface of the silicon layer and to allow it to diffuse superficially into the silicon layer by heat application. Finally, there is the possibility of introducing the dopants by ion implantation into the solid surface of the silicon layer.

Before the so prepared substrate-based semiconductor device is cooled to room temperature, it is advisable to turn down the temperature gradient between substrate and layer thereon at least substantially, that is to say, equalize the temperatures of the substrate body and the silicon layer, in order to avoid the occurrence of tensions. The cooling to room temperature may be speeded up, e.g., by blowing a cooling gas, such as argon or hydrogen.

It is preferred to carry out the process continuously as shown in the following description of the accompanying drawing which is a schematic illustration.

A flexible band 2 of graphite foil having a thickness of about 0.01–0.2 cm, preferably 0.03–0.07 cm, and a width which corresponds substantially to the width of the deposition chamber minus the wall thickness, thus depends on the dimensions of the device, and may be, e.g., 5–20 cm wide, is reeled off a supply roll 1 and placed between several pairs of rollers by which it is passed through the device. One pair of rollers designated by 3 is arranged near the supply roll and a second pair of rollers 4 near the exit of the device; instead of one pair of rollers 3 or 4, several pairs may be arranged, if desired. As the rollers turn at a rate of 1–15 cm per minute, preferably 3–7 cm/min., they move the band through the apparatus.

After having passed the first rollers 3, which may consist of high-grade steel, the graphite band 2 enters a gas trap 5 provided with a pressure-maintaining valve 5a, the band being there circulated by an inert gas, e.g., argon, under a pressure of 0.1–0.3 bar above the pressure of the following first deposition chamber 6; this arrangement avoids the possibility that reactive gases from chamber 6 could escape to the outside. The band 2 reaches chamber 6 after passage through the gas trap 5, and in the chamber it is met by a gas mixture blown through a narrow double tube, the inner tube 7 admitting, e.g., molybdenum hexacarbonyl advantageously in an amount of about 200–400 parts by volume of hydrogen, and diborane through the outer jacket 8 likewise, preferably in 200–400 parts by volume of hydrogen, the molar ratio calculated on the components molybdenum hexacarbonyl and diborane being preferably 1:2–1:4.

The gas mixture is blown out of the narrow, slit-shaped double tube, whose width corresponds substantially to the width of the graphite band 2 and which extends with its gas outlet opening to about 0.5–3 cm, preferably 1–2 cm, above the surface of the graphite band to receive the deposit at a pressure of 1–2 bar, preferably 1.1–1.4 bar; the rate at which the gas passes is adjusted in such a manner that an intermediate layer of molybdenum boride 12 is deposited on the band 2 in a thickness of 1–5 μm, preferably 1.5–3 μm, while the band traverses chamber 6, the temperature of the band being raised to about 750° to 1200° C, preferably 950° to 1100° C by direct passage of current of circuit 9 between terminals 10 and 11. Reaction gases escape from chamber 6 through exhaust tube 13.

After the first deposition chamber 6, which is only required when the formation of an intermediate layer between the substrate body and the silicon layer is intended, the graphite band 2 passes a gas trap 15 with a pressure, maintaining valve 15a; there, an inert gas, especially argon, is blown at a pressure of 0.1–0.3 bar above the pressure of the two adjacent chambers 6 and 14, which are preferably maintained at an almost equal pressure onto the surface of the intermediately coated graphite band 2, in order to prevent the reaction and decomposition gases from escaping from the two chambers.

Chamber 14 is the large deposition chamber where the deposition of silicon on the substrate is taking place. The gas for the deposition is admitted through tube 16. It consists of a mixture of, e.g., about 80–95 parts by volume of hydrogen and about 5–20 parts by volume of, for instance, trichlorosilane, the total, of course, adding up to 100% by volume; to this is added an amount of about 50–100 ppm diborane in hydrogen. Altogether, the amount of dopant added should be so calculated that in the deposition gas, an atomic ratio of boron:silicon would be $1:10^5$ to $1:10^7$. The size of the gas-admitting tube 16 is not critical provided only its sectional area permits the introduction of 1.1–1.4 bar in such an amount that during the passage of band 2, whether intermediately coated or not, through the large deposition chamber 14, doped silicon will be deposited in a thickness of 10–200 μm, preferably 50–150 μm, the deposition occurring on the band while it is heated up to 1000°–1250° C, preferably 1050°–1150° C by current supplied by circuit 17 between terminals 18 and 19. The reaction gases and unreacted deposition gases escape through a tube 20 from chamber 14.

After leaving the deposition chamber 14, the coated graphite band 2 enters a recrystallization chamber 22 which is filled with inert gas, e.g., argon, by means of a tube 21 having a pressure-maintaining valve 21a, the pressure being higher by 0.1–0.3 bar as compared to the one obtained in the chamber 14. In chamber 22, a lamp 24 carrying a halogen rod extending over the entire width of the band, is mounted, wherein a reflector 25 having an elliptic curvature focuses radiation, preferably on a small area of about 1–2 mm over the width of the band, whereby 80–95% of the thickness of the silicon layer is melted. When no intermediate layer was deposited on the substrate, the deposited silicon can be melted in its entirety, because no doping has to be faced. The basic load, with respect to the energy supply, is furnished through the substrate body, namely, by heating the band 2 by direct passage of current from the circuit 27 between terminals 28 and 29, raising the temperature to about 1150°–1250° C. By a gas admission tube 30 provided below band 2, an inert gas, e.g., argon of room temperature, thus about 25° C, is blown as coolant onto the band, thereby dissipating the heat of crystallization and causing an oriented growth of the resolidifying silicon from the substrate body toward the free surface.

Next, the graphite band 2 leaving recrystallization chamber 22 with the resolidified silicon layer 23 thereon, or, as the case may be, also carrying the intermediate layer 12, enters a doping chamber 32 covered by a quartz plate 31. Above the quartz plate, a lamp 33 having a halogen rod is arranged, and above the lamp an elliptically curved reflector 34, which superficially melts the resolidified silicon layer to a depth of 0.5–3 μm; a dopant is admitted having opposite polarity to the one already present in the silicon layer. The dopant is introduced by a gas inlet tube 35 extending about 0.5–3 cm, preferably 1–2 cm, toward the remelted place of the silicon layer. A suitable dopant is, e.g., phosphine, which is admitted in the amount of 50–100 ppm in hydrogen. This dopant has to be introduced in a quantity which will not only compensate the previously present dopant, but must provide one phosphorus atom for $10^3$ to $10^7$ silicon atoms. The reaction and residual gases are withdrawn through tube 36. The silicon layer 37 remelted to a width of 1–2 mm absorbed phosphorus from the decomposition of the phosphine with formation of a pn-transition to the adjacent silicon layer 23.

After having passed a gas trap 38 which is similarly built to traps 5 and 15 and after having traversed the pair of rollers 4, the polycrystalline silicon grown on the substrate graphite band, provided with a pn-transition and properly oriented during solidification, can be cut up into plates or boards of desired length with any suitable cutting or sawing device 39. The process can be carried out continuously. As soon as the supply roll 1 is empty, a new graphite band roll is simply installed, the end of the old roll and the beginning of the new one being sewn together or glued with the conventional carbon glue.

The large substrate-based plates made according to the invention, preferably the ones provided with a pn-transition, are used primarily as solar cells, which are distinguished by their length of useful life of the minority carriers. The effectiveness of these solar cells is up to 10% which proves the economy of the process according to the invention. This can be considered as an important step in the large-scale technical use of solar energy.

The process will now be more fully explained in a specific example which is given by way of illustration and not of limitation.

EXAMPLE

In accordance with the above-described continuous process, a graphite band having a width of 10 cm and a thickness of 0.05 cm is passed through a deposition apparatus at a rate of 5 cm/min. The gas pressure in both deposition chambers is 1.2 bar, the pressure of argon in the three gas traps and in the recrystallization chamber is 1.3 bar.

As the graphite band passes through the first deposition chamber having a length of 10 cm, a molybdenum boride layer of 1 μm thickness is deposited thereon. This is effected by pyrolytic decomposition of a mixture of molybdenum hexacarbonyl in 300 volume parts of hydrogen and of diborane, likewise in 300 volume parts of hydrogen, emerging from a nozzle arranged at 2 cm above the graphite band which is being heated to 1000° C by direct current passage; the molar ratio of molybdenum hexacarbonyl and diborane is 1:3. The gas passes through at the rate of 150 normal liters/hour.

In the second deposition chamber which has a length of 75 cm, a silicon layer of 150 μm is deposited on the graphite band with its intermediate layer which has a temperature of 1150° C. The deposition is brought about by the decomposition of a mixture containing 7% of saturated gas with 93 volume % hydrogen and 7 volume % trichlorosilane to which a dopant gas, consisting of hydrogen and 100 ppm diborane, has been added in such an amount that the deposition gas contains a total of 0.5 ppm diborane, the mixture passing over the graphite band at a rate of 500 normal liters/hour.

Subsequently, the band temperature is raised to 1200° C, and by means of the described lamp having a halogen rod and an elliptical reflector, a narrow zone of 1 mm is melted over the entire width of the band, the depth of the zone being about 140 μm. The zone is then resolidified by blowing argon of room temperature onto the band from below.

The resolidifed silicon layer is then once more melted by a second lamp with a halogen rod and reflector, the remelting being only effected superficially for a depth of about 1 μm, and a pn-transition is obtained by the incorporation of phosphorus derived by decomposition of a doping gas consisting of hydrogen with 100 ppm phosphine.

The silicon-coated graphite band is removed from the apparatus over the rollers at the rear end and is cut into plates of 10 cm length by a diamond saw.

When appropriately connected, the plates exhibit an effectiveness of 6–8%.

What is claimed is:

1. A process for producing large-size, substrate-based semiconductor material of silicon deposited on a substrate body from the gaseous phase, which comprises the steps of heating a substrate body by direct current passage to deposition temperature, contacting said body with a gaseous silicon-containing mixture to which a dopant has been added, until a deposit having a thickness from about 10 to 200 μm has been formed, subsequently melting 80 to 100% of the deposited silicon layer from the free surface downward, and resolidifying the molten silicon by adjustment of a temperature gradient from the substrate body upwardly to cause an oriented growth of the resolidifying silicon from the substrate body towards the free surface.

2. The process according to claim 1 wherein the substrate body is a graphite foil.

3. The process according to claim 1 wherein the substrate body is a molybdenum band.

4. The process according to claim 1 wherein an intermediate layer is applied to the substrate body before the silicon is deposited.

5. The process according to claim 1 wherein the gaseous compound from which the silicon is deposited is a mixture of trichlorosilane and hydrogen.

6. The process according to claim 1 wherein the silicon layer deposited from the gas phase is partially melted by a radiation source mounted above the same.

7. The process according to claim 6 wherein the main energy supply for the melting is delivered by heating up the substrate body.

8. The process according to claim 6 wherein the molten layer of silicon is resolidified and thereafter melted once more, whereupon a dopant is added to the melted surface layer causing the silicon to become doped in opposite conductivity to the dopant originally added in order to provide a pn-transition.

9. The process according to claim 1 wherein the steps are carried out in continuous operation.

10. The process according to claim 1 including the step of cutting the large-size semiconductor material into plates to be used as solar cells.

* * * * *

UNITED STATES PATENT OFFICE
CERTIFICATE OF CORRECTION

Patent No. 4,113,532  Dated September 12, 1978

Inventor(s) Bernhard Authier et al.

It is certified that error appears in the above-identified patent and that said Letters Patent are hereby corrected as shown below:

Column 2, line 44, "decomposition" should read

-- deposition --.

Signed and Sealed this

*Twenty-third* Day of *January 1979*

[SEAL]

Attest:

RUTH C. MASON
*Attesting Officer*

DONALD W. BANNER
*Commissioner of Patents and Trademarks*